United States Patent
Perner et al.

(10) Patent No.: US 7,913,130 B2
(45) Date of Patent: Mar. 22, 2011

(54) MULTI-SAMPLE READ CIRCUIT HAVING TEST MODE OF OPERATION

(75) Inventors: Frederick A. Perner, Palo Alto, CA (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2007 days.

(21) Appl. No.: 10/698,896

(22) Filed: Oct. 31, 2003

(65) Prior Publication Data
US 2005/0102576 A1  May 12, 2005

(51) Int. Cl.
*G11C 29/00* (2006.01)
*G11C 7/00* (2006.01)
(52) U.S. Cl. .................... 714/719; 365/201
(58) Field of Classification Search .......... 714/718, 714/721, 702, 719; 365/189.09, 201, 206; 711/101
See application file for complete search history.

(56) References Cited

U.S. PATENT DOCUMENTS

| 6,188,615 B1 | 2/2001 | Perner et al. |
| 6,529,460 B1 * | 3/2003 | Belser ................. 369/59.21 |
| 7,009,901 B2 * | 3/2006 | Baker ..................... 365/207 |

FOREIGN PATENT DOCUMENTS

| JP | 410027498 A | * | 1/1998 |
| JP | 2002056810 | * | 3/2002 |

* cited by examiner

*Primary Examiner* — Cynthia Britt

(57) ABSTRACT

A data storage device includes non-volatile memory; and a read circuit for performing multi-sample read operations on the memory during a normal mode of operation. The read circuit includes a digital counter having an output that indicates a single bit (e.g., a sign-bit). The read circuit allows an external device (e.g., a memory tester) to supply test clock pulses to an input of the digital counter during a test mode. The test clock pulses can be counted to determine a state of the digital counter.

18 Claims, 5 Drawing Sheets

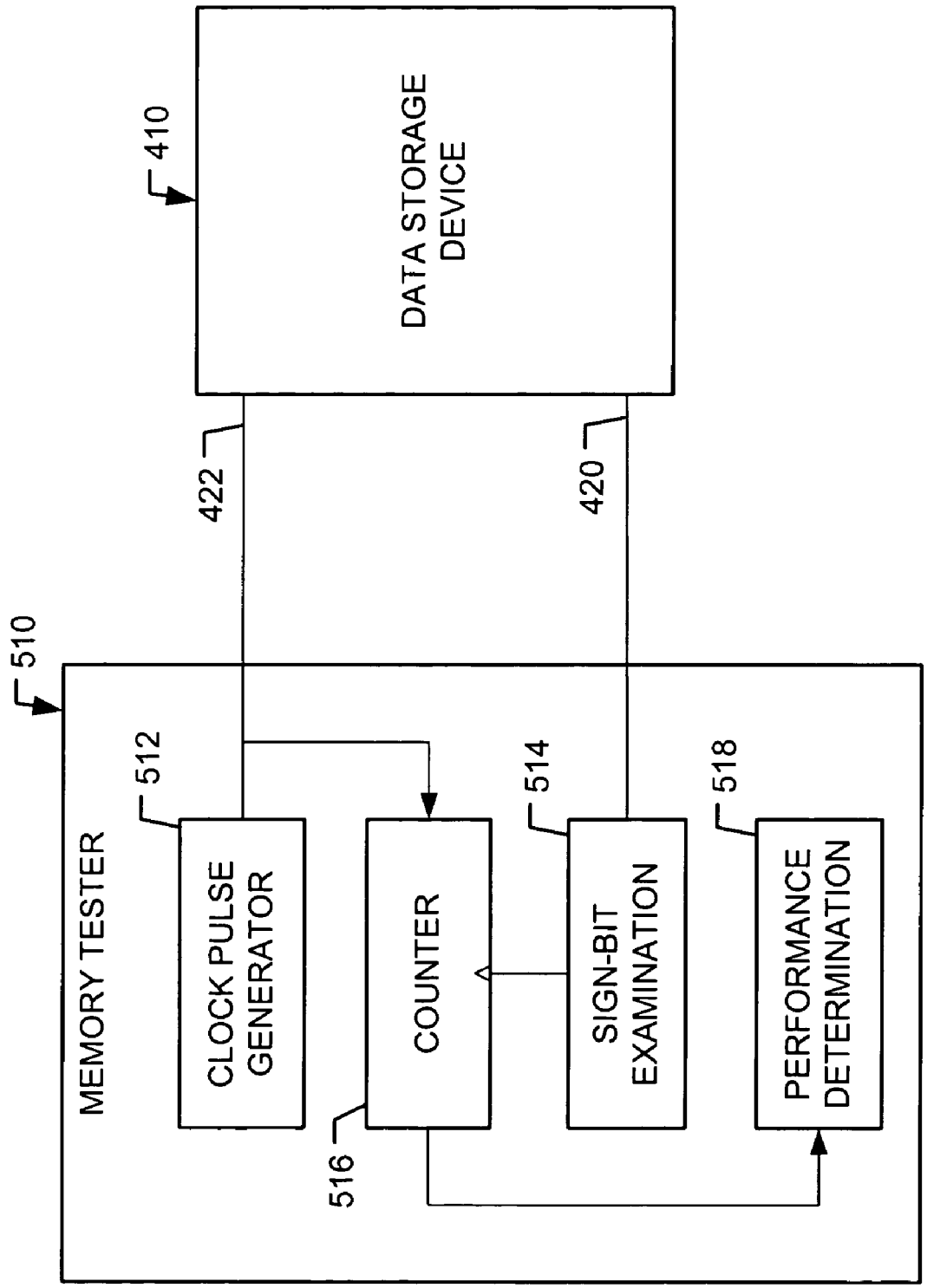

MULTI-SAMPLE READ CIRCUIT HAVING TEST MODE OF OPERATION

BACKGROUND

Multi-sample read operations can be performed in certain non-volatile memory devices. Consider the example of a resistive cross point array of non-volatile memory cells. A multi-sample read operation may be performed on a selected memory cell in the array by taking a first sample of the memory cell, and then taking one or more subsequent samples. The first sample generates a value corresponding to the logic value stored in the selected memory cell. The subsequent samples are used to generate a reference value. A comparison of the first-sampled value and the reference value indicates whether the first-sampled value corresponds to a logic '1' or a logic '0.'

This multi-sample read operation is considered self-referencing because the first-sampled value is not compared to an external reference. Self-referencing read operations in general tend to be more reliable than read operations in which sensed values are compared to an external reference values. Moreover, due to limitations on the fabrication of certain cross point memory cell arrays, it can be difficult to find a single reference value for all of the memory cells in a large array.

Digital sense amplifiers can be used to perform multi-sample read operations on non-volatile memory. Consider the example of a digital sense amplifier including an integrator and a digital counter. A sense operation involves integrating a charge at a rate that depends upon the logic state of the selected memory cell, and determining the time for the charge to reach a threshold (the first sample may include one or more sense operations). The time is determined by using the digital counter to count clock pulses. A reference count is then subtracted from the clock pulse count (in a self-referencing operation, one or more samples are taken to generate the reference count). If $CNT_0 < CNT_R < CNT_1$, the most significant bit of the count indicates whether the logic value initially stored in the selected memory cell was a logic '1' or a logic '0' ($CNT_R$ is the reference count, $CNT_0$ is the count corresponding to a logic 0, and $CNT_1$ is the count corresponding to a logic 1).

Certain digital sense amplifiers output only the most significant bit of the count. The full contents of the digital counter are not made available.

During testing of the resistive cross point array, however, it can be helpful to know the contents of the digital counters, not just the sign of the most significant bit. The count at the end of the read operation can be used to determine signal-to-noise ratio (SNR). Measured as the ratio of the signal out of the digital amplifier to the noise generated within the digital amplifier where the signal is taken out, the SNR is a measure of reliability.

It would be desirable have the ability to determine the contents of the digital counter at the end of a multi-sample read operation. It would also be desirable to add this ability with a minimal amount of circuitry, since adding circuitry can increase the cost of the memory.

SUMMARY

According to one aspect of the present invention, a data storage device includes non-volatile memory; and a read circuit for performing multi-sample read operations on the memory during a normal mode of operation. The read circuit includes a digital counter having an output that indicates a single bit. The read circuit allows test clock pulses to be applied to the digital counter during a test mode. The test clock pulses can be counted to determine a state of the digital counter.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 5 is an illustration of a memory tester in accordance with an embodiment of the present invention.

DETAILED DESCRIPTION

Figure 1:
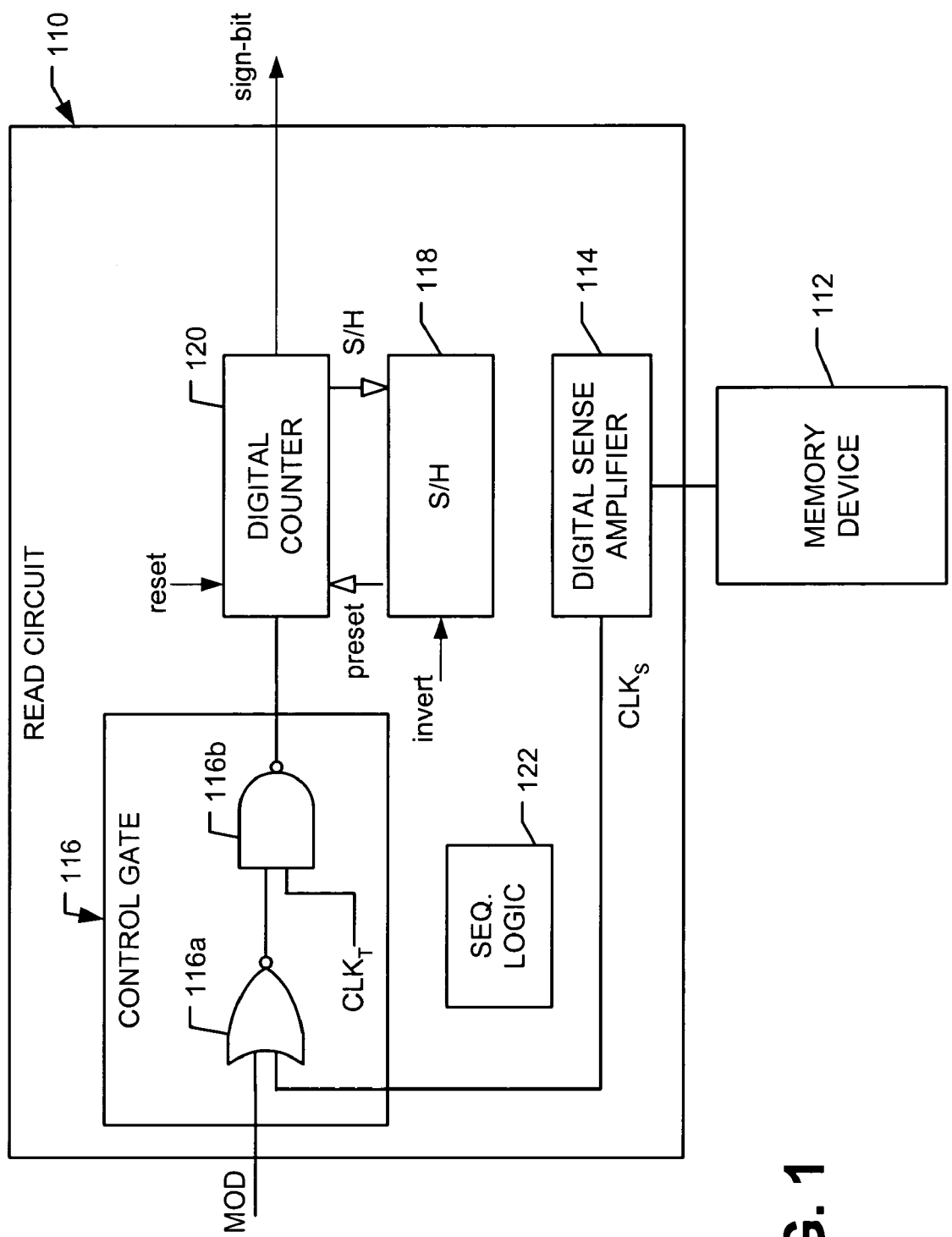
FIG. 1 is an illustration of a read circuit for performing read operations on non-volatile memory in accordance with an embodiment of the present invention.

As shown in the drawings for purposes of illustration, the present invention is embodied in a read circuit including a digital sense amplifier for performing multi-sample read operations on non-volatile memory. The non-volatile memory is not limited to any particular type. Although examples involving Magnetic Random Access Memory ("MRAM") will be used below, the read circuit is not limited to MRAM. The read circuit can be used with other types of resistive cross point random access memory arrays, including but not limited to arrays of phase change memory, polymer memory, and molecular memory. The read circuit can also be used with forms of resistive cross point anti-fuse write once memory.

The digital sense amplifier is not limited to any particular type. See, for example, assignee's U.S. Pat. No. 6,188,615, which is incorporated herein by reference.

Reference is made to FIG. 1, which illustrates a read circuit 110 coupled to a non-volatile memory device 112. The read circuit 110 may be connected directly to the memory device 112, or it may be coupled indirectly to the memory device 112. The read circuit 110 may be indirectly coupled to the memory device 112 if, for example, the memory device 112 is part of a large memory cell array.

The read circuit 110 includes a digital sense amplifier 114, a control gate 116, a sample/hold (S/H) 118, and a digital counter 120. Asserting a reset signal sets the state of the digital counter 120 to zero. Asserting a preset signal loads the state of the S/H 118 into the digital counter 120. Asserting a S/H signal loads the state of the digital counter 120 into the S/H 118. Asserting an invert signal causes the S/H 118 to change the sign of its state. Sequencing logic 122 can assert these signals at the appropriate times.

The read circuit 110 is operable in normal and test modes. During the normal mode of operation, the control gate 116 connects an output of the digital sense amplifier 114 to an input of the digital counter 120. During the test mode of operation, the control gate 116 disconnects the output of the digital sense amplifier 114 and instead allows an external source (not shown) to supply test clock pulses ($CLK_T$) to the input of the digital counter 120.

The control gate 116 is not limited to any particular implementation. However, a simple implementation is illustrated in FIG. 1. The control gate 116 of FIG. 1 includes a NOR gate 116a and a NAND gate 116b. A first input of the NOR gate 116a is adapted to receive a signal (MOD) indicating the mode of operation. A second input of the NOR gate 116a is connected to an output of the digital sense amplifier 114. A first input of the NAND gate 116b is connected to an output of the NOR gate 116a. A second input of the NOR gate 116a is adapted to receive the test clock pulses ($CLK_T$) from the external source. An output of the NAND gate 116b is connected to an input of the digital counter 120.

A multi-sample read operation is performed when the normal mode of operation is commanded (via the signal MOD). The multi-sample read operation may be performed as follows. A first sample of the memory device 112 is taken. The digital sense amplifier 114 senses the state of the memory device 112, and provides a stream of clock pulses ($CLK_S$), the number of which represents the state of the memory device 112. The control gate 116 routes the sense clock pulses ($CLK_S$) to an input of the digital counter 120. The digital counter 120 counts the number of clock pulses ($CLK_S$). At the end of the sense operation, the count stored in the digital counter 120 represents the logic value stored in the memory device 112.

Additional sense operations may be performed during the first sample. The digital counter keeps a running sum of the results of these sense operations.

At least one additional sample is then taken to establish a reference count. Each additional sample may involve writing a known value to the memory device 112 and sensing the corresponding state of the memory device 112. The digital sense amplifier 114 generates a stream of sense clock pulses ($CLK_S$), which the control gate 116 routes to the input of digital counter 120.

During these additional samples, the sense clock pulses ($CLK_S$) reduce the count in the digital counter 120. In this manner, the reference count is subtracted from the count representing the stored logic value.

At the end of multi-sample read operation, the sign-bit of the digital counter 120 is examined. The sign-bit indicates whether a logic '1' or a logic '0' was sensed during the first sample.

In the alternative, the digital sense amplifier 114 may take a first sample, and save the count, then take at least one additional sample to establish a reference count, and then compare the stored count to the reference count. An output of the comparison is equivalent to the sign-bit of the digital counter 120.

The multi-sample read operation is destructive since the logic value sensed during the first sample was overwritten. Therefore, the logic value is written back to the memory device 112 at the end of the read operation. An exemplary three-sample read operation is illustrated in FIG. 2 and described below.

At the end of the multi-sample read operation, the read circuit 110 outputs the sign-bit of the count, but not the full count in the digital counter 120. However, when operated in the test mode, the read circuit 110 allows the full count to be determined.

Figure 2:
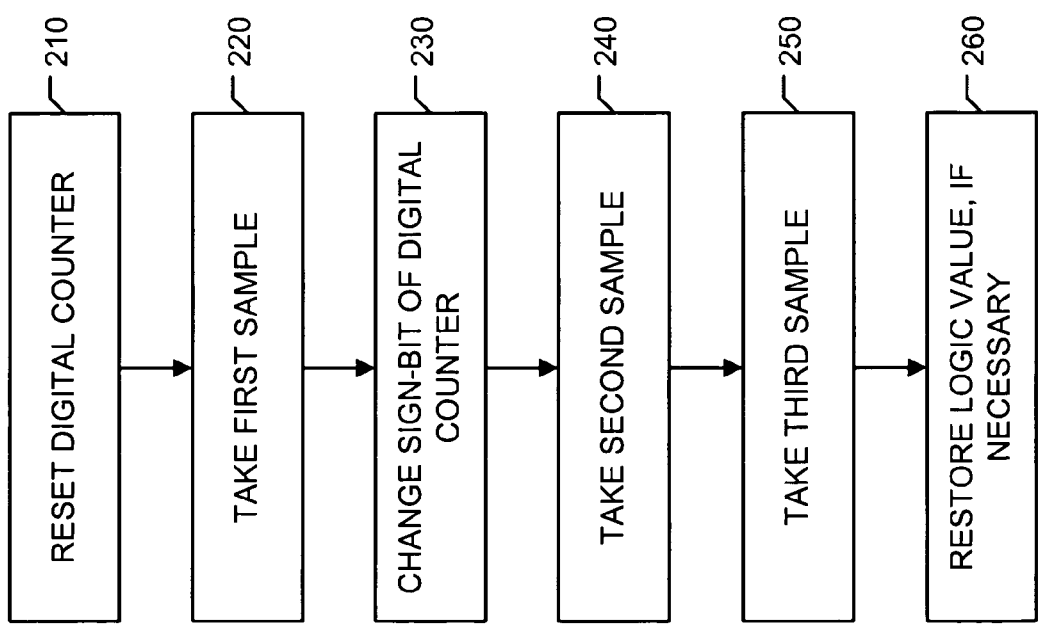
FIG. 2 is an illustration of a method of operating a read circuit in a normal mode in accordance with an embodiment of the present invention.

Reference is made to FIG. 2, which describes a three-sample read operation. The read circuit 110 is not limited to a three-sample read operation Two samples could be taken, or four or more samples could be taken. The three sample read operation is provided merely as an example.

The reset signal is asserted, whereby the counter 120 is reset to zero (210). A first sample of the memory device 112 is taken by performing two consecutive sense operations on the memory device 112 (220). During the first sense operation, the digital sense amplifier 114 sends sense clock pulses ($CLK_S$) to the digital counter 120. The number of sense clock pulses ($CLK_S$) represents the logic value stored in the memory device 112. During the second sense operation, the digital sense amplifier 114 once again sends sense clock pulses to the digital counter 120. The additional number of pulses represents the logic value stored in the memory device 112. The count in the digital counter 120 is cumulative, in that it is not reset after each sense operation. Thus far, the count in the digital counter 120 indicates the number of pulses occurring during both the first and second sense operations.

The contents of the digital counter 120 are shifted to the S/H 118, and then the S/H 118 shifts the negative value back to the digital counter 120. Hence the sign-bit of the digital counter 120 is flipped to negative (230).

A second sample is taken (240). A first logic value is written to the memory device 112, and a sense operation is performed. The number of sense clock pulses ($CLK_S$) that occur during the second sample represents the first logic value. Each of these sense clock pulses ($CLK_S$) causes the digital counter 120 to count up (the negative count becomes less negative). At the end of the second sample, the count is increased by the number of pulses that represent the first logic value.

A third sample is taken (250). A second logic value is written to the memory device 112, and a sense operation is performed. The number of sense clock pulses ($CLK_S$) that occur during the third sample represents the second logic value. Each of these sense clock pulses ($CLK_S$) causes the digital counter 120 to count up. At the end of the third sample, the value in the digital counter is $-CNT_{read1}-CNT_{read2}+CNT_{logic1}+CNT_{logic2}$.

The most significant bit of the count indicates the logic value that was sensed during the first sample.

Consider the example of a magnetic tunnel junction. The magnetic tunnel junction has an initial resistance of R, which corresponds to a first logic value. The count representing this logic value is (ideally) X. The resistance R(1+TMR) corresponds to second logic value, and is represented by the count X+Y, where Y>0, and TMR is the tunneling magnetoresistance ratio of the magnetic tunnel junction. Table 1 summarizes the state of the digital counter 120 at various points in the triple-sample read operation. At the end of the third sample, the state of the digital counter 120 has a positive sign (since Y>0). This indicates that the first logic value was initially stored in the memory device 112. Had the second logic value been initially stored in the memory device 112, the digital counter state at the end of the third sample would have been −Y, and the sign-bit would have been negative.

TABLE 1

| Operation | Counter state |
| --- | --- |
| Sense 1, sample 1 | X |
| Sense 2, sample 1 | 2X |
| Change sign | −2X |
| Sense, sample 2 | −X |
| Sense, sample 3 | Y |

This multi-sample read operation is destructive, since the initial logic value is overwritten. Therefore, the initial logic value is restored (260), if the initial logic value is different than the logic value written during the third sample.

Different test modes can be selected. The different test modes determine the digital count at different stages of a multi-sample read operation.

During the test mode, the contents of the digital counter 120 are shifted to the S/H 118, and then the S/H 118 shifts the negative value back to the digital counter 120. The external source supplies test clock pulses ($CLK_T$) to the input of the digital counter 120, which causes the digital counter 120 to count up. The test clock pulses ($CLK_T$) are supplied until the sign-bit indicates that the sign changes (that is, the count is zero). The test clock pulses ($CLK_T$) are counted until the sign-bit changes. The count of test clock pulses ($CLK_T$) is equal to the count that was shifted to the S/H 118 at the beginning of the test mode. The original count can be restored to the digital counter 120 by shifting the contents of the S/H 118 back into the digital counter 120.

Figure 3A:
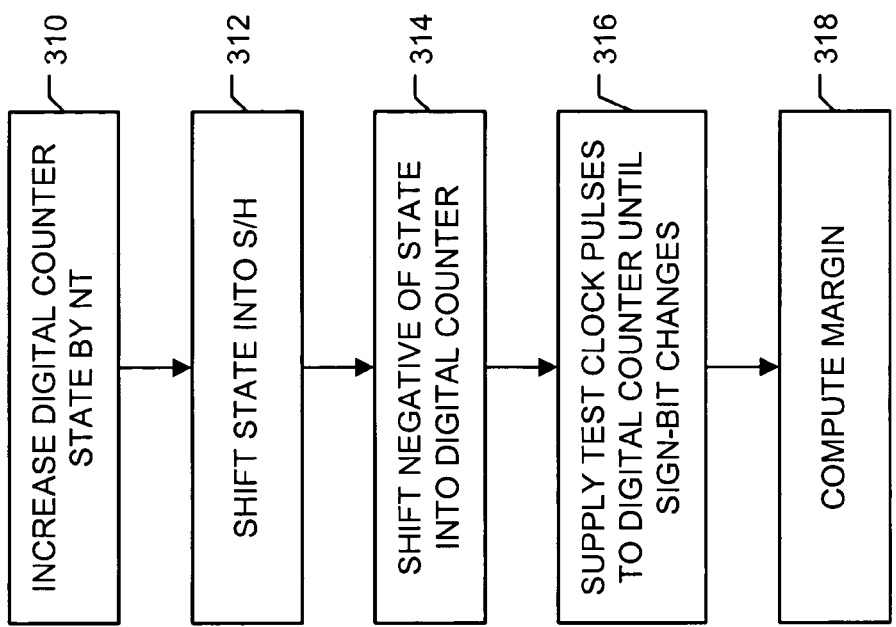
FIGS. 3a–3c are illustrations of methods of operating a read circuit in test modes in accordance with different embodiments of the present invention.

Reference is now made to FIG. 3a, which describes an exemplary test mode A. Test mode A is commanded after a multi-sample read operation has been performed. The objective of test mode A is to determine the state of the digital counter 120 at the end of the read operation.

An external source supplies a total of NT test clock pulses ($CLK_T$) to the input of the digital counter 120 (310), whereby the count CNT is increased by NT. CNT is the current count in the digital counter 120 at the end of the multi-sample read operation, and NT is a number of counts that is assumed to be larger than the most negative count that may be sensed. When NT is added to the contents of the digital counter 120, the resulting count will always be positive (i.e., the MSB will always be 0).

The count CNT+NT is copied to the S/H 118 (312). The digital counter is then preset with the negative of the state stored in the S/H 118 (314).

The external source supplies and counts test pulses to the input of the digital counter 120 until the sign-bit indicates that the sign of the digital counter state has changed (316). This additional number of pulses is designated as ΔnT.

The amount of margin is computed (318). The amount of margin may be computed as m=NT−CNT if ΔnT<NT, and n=CNT−NT CNT if ΔnT>NT. The interpretation of 'm' is the margin of a sign-bit that is '0' MSB, and 'n' is the margin of a sign-bit that is '1'.

These margins represent the signal out of the digital sense amplifier 114. The larger the margins, the larger the sense signal that had been generated by the multi-sample read operation. Noise can be measured for the multi-sample read operation by performing the sense operation without writing the reference bits. An ideal margin value for the output from the noise sensing would be 'm' or 'n' equal to 1 or 0. A noise characterization of the digital sense amplifier 116 may represent hundreds or thousands of noise sense operations and the values for 'n_noise' and 'm_noise' may be greater than '1' or '0' due to various noise sources affecting the sense counts during the sense operations. The SNR for the digital sense amplifier 114 may be defined as the ratio of the sense margin 'm' divided by the noise sense margin 'm_noise' to define the SNR for a MSB of '0' and as the ratio of the sense margin 'n' divided by the noise sense margin 'n_noise' to define the SNR for a MSB of '1'.

Figure 3C:
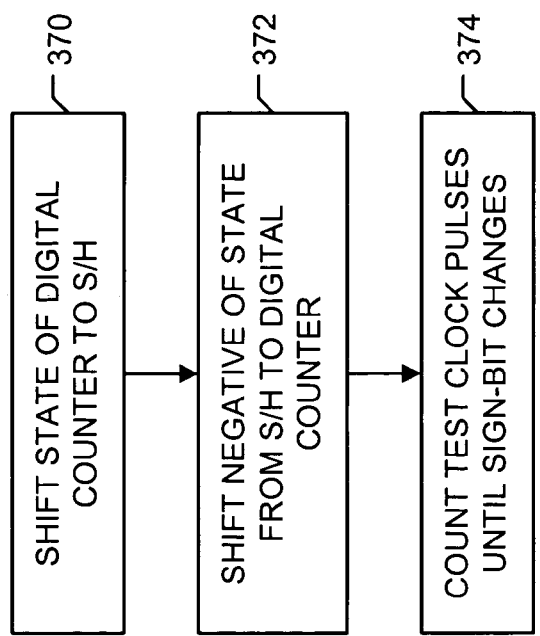
Figure 3B:
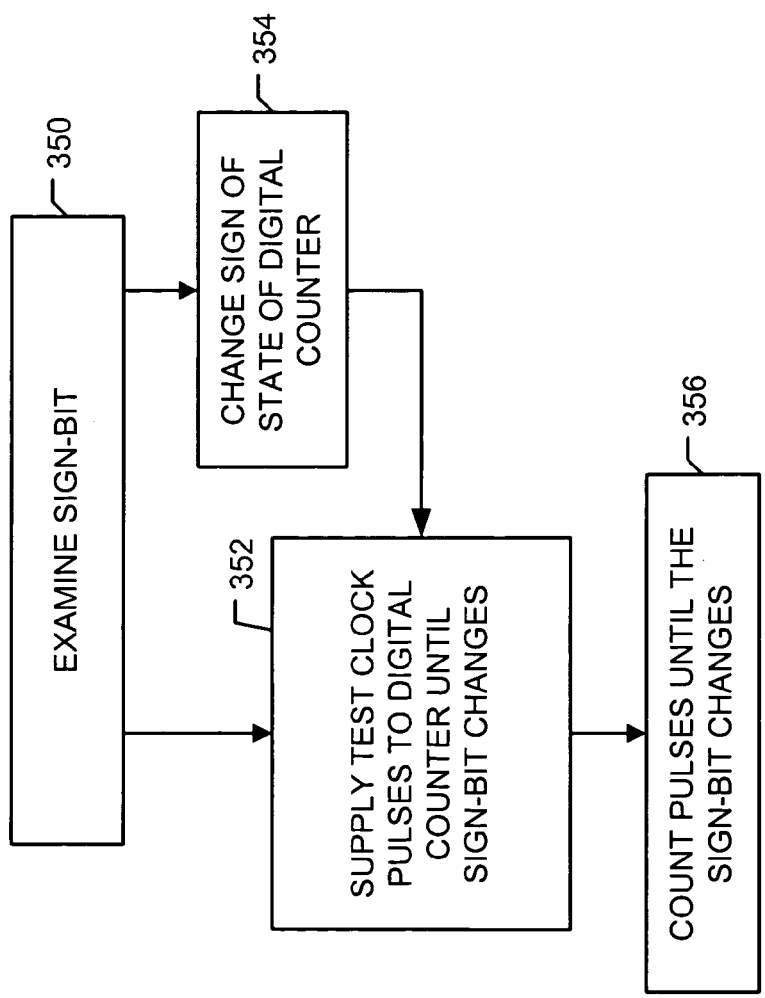

Reference is now made to FIG. 3b, which describes an exemplary test mode B. Test mode B is commanded after a multi-sample read operation has been performed. The objective of test mode B is also to determine the value of the digital counter 120 at the end of the multi-sample read operation.

The sign-bit is examined (350). If the sign-bit indicates a negative value, the external source supplies test clock pulses ($CLK_T$) to the digital counter 120, until the digital counter 120 counts up to zero (352). The external source supplies and counts the test clock pulses ($CLK_T$) until the sign-bit indicates that the digital counter state has reached zero.

If the sign-bit is '0', the digital counter state is transferred to the S/H 118, and the digital counter 120 is preset to the negative of the value in the S/H 118 (354). The external source supplies test clock pulses ($CLK_T$) to the digital counter 120, until the sign-bit flips to zero (352). The test pulses are counted until the sign-bit changes (356).

Reference is now made to FIG. 3c, which describes a test mode C. The objective of test mode C is to determine the state of the digital counter 120 sometime during the multi-sample read operation. Thus test mode C is commanded sometime during the multi-sample read operation.

The state of the digital counter 120 is shifted to the S/H 118 (370), and the digital counter 120 is preset with the negative of the state of the S/H 118 (372). The external source supplies and counts test clock pulses ($CLK_T$) to the digital counter 120 until the sign-bit changes (374). The counted number of test clock pulses ($CLK_T$) is equal to the state of the digital counter 120 when test mode C was commanded. The digital counter 120 is preset to the value in the S/H 118 (thereby restoring the state of the digital counter 120), and the multi-sample read operation is resumed.

Figure 4:
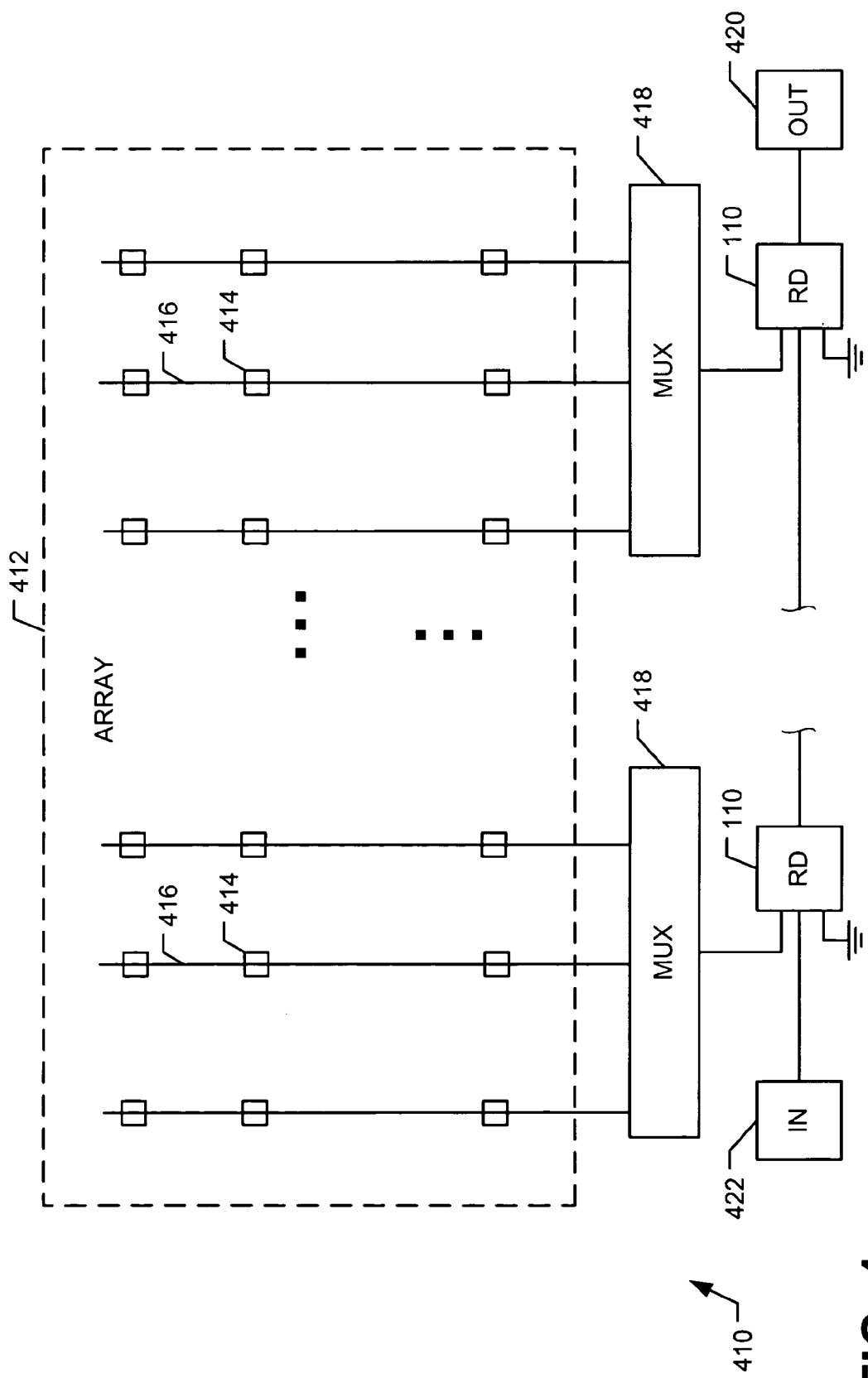
FIG. 4 is an illustration of a data storage device in accordance with an embodiment of the present invention.

Reference is made to FIG. 4, which illustrates a data storage device 410 including a resistive cross point array 412 of memory cells 414. Bit lines 416 extend along columns of the array 412. One read circuit 110 is provided for multiple columns. During a read operation, a multiplexer 418 connects a read circuit 110 to a selected bit line 416. The outputs (sign-bits) of the read circuits 110 may be connected in a scan chain, which terminates in a first pin 420. The inputs to the read circuits 110 (for the test clock pulses) may be connected in a scan chain, which terminates in a second pin 422.

Reference is now made to FIG. 5. A memory tester 510 includes a clock generator 512 for providing the test clock pulses to the read circuit 120. The tester 510 can also include a circuit 514 for examining the sign-bit, and a counter 516 for counting the number of test clock pulses until the sign-bit changes. The state of the counter 516 can be displayed by the memory tester 510.

The memory tester 510 may be separate from the data storage device 410. The memory tester 510 can be connect to the first and second pins 420 and 422. The first pin 420 provides the sign-bit to the tester 510. The memory tester 510 provides the test clock pulses to the second pin 422.

The memory tester 510 may also include a module 518 for determining the relative performance of the data storage device 410. For example, the memory tester 510 may perform a binning function on a plurality of different data storage devices. Binning is a process of sorting chips according to some performance parameter. For example, the data storage devices could be binned by separating them according to the value of the first sense count performed during the first sample. The faster data storage devices would come from the bin with the smallest sense counts. As another example, the data storage devices could be binned on SNR, which roughly specifies the expected reliability of the sense operations.

The present invention is not limited to the specific embodiments described above. Instead, the present invention is construed according to the claims the follow.

The invention claimed is:
1. A data storage device comprising:
non-volatile memory; and
a read circuit for performing multi-sample read operations on the memory during a normal mode of operation, the read circuit including a digital counter for storing an n-bit count, where n>1, the digital counter having an output that indicates only a single bit of the count;

the read circuit allowing test clock pulses to be applied to the digital counter during a test mode of operation;

whereby the test clock pulses can be counted to determine a state of the digital counter.

2. The device of claim 1, wherein the read circuit further includes a digital sense amplifier for performing the multi-sample read operations, an output of the digital sense amplifier connected to an input of the digital counter during the normal mode of operation.

3. The device of claim 2, wherein the performing a multi-sample read operation includes using the digital sense amplifier to take a first sample and cause a state of the digital counter to represent the result of the first sample; using the digital sense amplifier to establish a reference count, and making a comparison of the digital counter state to the reference count.

4. The device of claim 3, wherein the read circuit further includes a sample/hold for shifting the digital counter state between the sample/hold and the digital counter, and for inverting the sign of its state.

5. The device of claim 2, wherein the digital sense amplifier includes an integrator for integrating a charge at a rate that is dependent upon a logic value stored in a selected memory device; and wherein the state of the digital counter is changed at a rate that is proportional to the integration time.

6. The device of claim 1, wherein the single bit is a sign-bit of the count.

7. The device of claim 1, wherein the non-volatile memory includes a resistive cross point array of memory cells.

8. The device of claim 1, wherein the non-volatile memory includes an MRAM array.

9. The device of claim 1, further comprising a digital sense amplifier and means for connecting an output of the digital sense amplifier to an input of the digital counter during the normal mode of operation, the means disconnecting the output of the digital sense amplifier and instead allowing an external source to supply the test clock pulses to the input of the digital counter during the test mode of operation.

10. A read circuit for a memory device, the circuit comprising:

first means for performing a multi-sample read operation on the memory device, the first means including a digital counter, an output of the digital counter indicating a sign-bit; and second means for allowing contents of the digital counter to be determined by an external device at least one of during and after the multi-sample read operation.

11. A method of using a memory device, the method comprising:

performing a multi-sample read operation on the memory device; the multi-sample read operation including a plurality of sense operations on the memory device, a digital counter used during the multi-sample read operation to generate a running sum of values, each value representing a resistance that was sensed during one of the sense operations; and determining the state of the digital counter during or after the multi-sample read operation, wherein determining the state includes sending clock pulses to an input of the digital counter until a change in a sign-bit of the digital counter, and counting the clock pulses that were sent to the digital counter.

12. The method of claim 11, wherein the digital counter state is determined prior to completion of the multi-sample read operation, whereby the state indicates a read access time.

13. The method of claim 11, wherein the digital counter state is determined after the multi-sample read operation has been performed, whereby the state indicates a margin.

14. The method of claim 11, wherein performing a multi-sample read operation includes taking a first sample of the memory device and causing a state of the digital counter to represent the result of the first sample; using the memory device to establish a reference count, and making a comparison of the reference count and the result of the first sample.

15. The method of claim 14, wherein each sample includes a sense operation, each sense operation performed by integrating a charge at a rate that is dependent upon a logic value store in the memory device; and using the digital counter to measure the integration time.

16. A system comprising:

a data storage device including a resistive cross point array of memory cells, and a read circuit operable in normal and test modes of operation, the read circuit including a digital sense amplifier for performing multi-sample read operations on selected memory cells of the array during the normal mode and a digital counter for storing results of the multi-sample read operations, an output of the digital counter providing a sign-bit;

a memory tester including a source for generating test clock pulses, a circuit for determining when the sign-bit changes, and a counter for counting the test clock pulses until the sign-bit changes.

the read circuit allowing the test clock pulses to be applied to the digital counter during the test mode of operation.

17. Apparatus for externally testing a non-volatile memory device including a digital counter, the counter having an input and an output, the output indicating only a sign-bit, the apparatus comprising:

means for supplying test clock pulses to the input of the counter;

means for examining the output of the digital counter to determine when the sign-bit changes;

means for counting a number of test clock pulses supplied to the counter input, the count being stopped when the sign-bit changes; and means for using the count of test clock pulses to determine a performance parameter of the non-volatile memory.

18. The method of claim 17, wherein a binning function is performed by the means for using the count.

* * * * *